United States Patent
Kiryu et al.

(10) Patent No.: US 7,397,669 B2
(45) Date of Patent: Jul. 8, 2008

(54) SEMICONDUCTOR DEVICE MOUNTING SOCKET

(75) Inventors: Koichi Kiryu, Shimotakai (JP); Toshihiro Kusagaya, Shinagawa (JP); Hideo Miyazawa, Shinagawa (JP); Osamu Daikuhara, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 259 days.

(21) Appl. No.: 11/410,817

(22) Filed: Apr. 26, 2006

(65) Prior Publication Data

US 2007/0097606 A1 May 3, 2007

(30) Foreign Application Priority Data

Sep. 12, 2005 (JP) ............................. 2005-264359

(51) Int. Cl.
*H05K 1/00* (2006.01)
(52) U.S. Cl. ...................................... 361/748; 361/679
(58) Field of Classification Search .................. 439/65, 439/68, 73, 331; 361/748, 760, 761, 679, 361/687, 689, 678, 970, 765; 257/784, 786, 257/678–690, 693, 692, 700; 324/765
See application file for complete search history.

(56) References Cited

U.S. PATENT DOCUMENTS 5,394,009 A * 2/1995 Loo ............................ 257/666
5,490,324 A * 2/1996 Newman ....................... 29/830
6,346,743 B1 * 2/2002 Figueroa et al. ............. 257/723
6,492,737 B1 * 12/2002 Imasu et al. ................. 257/778
6,907,658 B2 * 6/2005 Li ................................ 29/832

FOREIGN PATENT DOCUMENTS

JP 2003-178847 6/2003

* cited by examiner

*Primary Examiner*—M. Wilczewski
*Assistant Examiner*—Swapneel Chhaya
(74) *Attorney, Agent, or Firm*—Staas & Halsey LLP

(57) ABSTRACT

A semiconductor device mounting socket is disclosed that is fixed to a motherboard and is used for mounting a surface mounted semiconductor device on the motherboard. The semiconductor device mounting socket includes a bracket that is fixed to the motherboard and a pad pitch converting member that is arranged within the bracket. The pad pitch converting member includes an upper face on which semiconductor device side pads are arranged at a first pitch corresponding to the pitch of pads of the surface mounted semiconductor device, and a lower face on which motherboard side pads that are electrically connected to the semiconductor device side pads are arranged at a second pitch that is different from the first pitch. The surface mounted semiconductor device is arranged above the pad pitch converting member within the bracket.

6 Claims, 9 Drawing Sheets

SEMICONDUCTOR DEVICE MOUNTING SOCKET

BACKGROUND OF THE INVENTION

1. Field of the Invention

The present invention relates to a semiconductor device mounting socket that is used for mounting a BGA (Ball Grid Array) semiconductor device or a LGA (Land Grid Array) semiconductor device on a motherboard.

2. Description of the Related Art

A semiconductor device mounting socket is used to mount a BGA semiconductor device or a LGA semiconductor device on a motherboard in order to facilitate exchange of the semiconductor device when the semiconductor device breaks down. In this case, the semiconductor device mounting socket is fixed to the motherboard and the semiconductor device is detachably arranged on the semiconductor device socket.

It is noted that a semiconductor device mounting socket includes a frame-shaped bracket into which a semiconductor device is arranged and an anisotropic conductive sheet.

The semiconductor device mounting socket is fixed to the motherboard, and the anisotropic conductive sheet is arranged within the bracket so that the semiconductor device comes into contact with the anisotropic conductive sheet upon engaging the bracket. In this way, electrical connection is made between pads of the semiconductor device and pads of the motherboard via the anisotropic conductive sheet, and the semiconductor device is mounted on the motherboard.

In the case of using the semiconductor device mounting socket as is described above, the arrangement of the pads within a semiconductor device mounting region of the motherboard normally has to correspond to the pitch of the pads of the BGA semiconductor device or the LGA semiconductor device.

However, in recent years and continuing, the pitch of the pads of the BGA semiconductor device and the LGA semiconductor device is decreasing to about 0.5 mm. In turn, the pitch of the pads arranged on the motherboard has to be narrowed as well. When the pitch of the pads on the motherboard is narrowed, the number of layers making up the motherboard has to be increased, and as a result, the cost for manufacturing the motherboard is increased.

SUMMARY OF THE INVENTION

According to an embodiment of the present invention, a semiconductor device mounting socket for mounting a semiconductor device on a motherboard is provided that does not require the pitch of the pads of the motherboard to correspond to the pitch of the pads of the semiconductor device.

According to one specific embodiment of the present invention, a semiconductor device mounting socket is provided that is fixed to a motherboard and is used for mounting a surface mounted semiconductor device on the motherboard, the semiconductor device mounting socket including:

a bracket that is fixed to the motherboard; and a pad pitch converting member that is arranged within the bracket, the pad pitch converting member including an upper face on which semiconductor device side pads are arranged at a first pitch corresponding to a pitch of pads of the surface mounted semiconductor device, and a lower face on which motherboard side pads that are electrically connected to the semiconductor device side pads are arranged at a second pitch that is different from the first pitch;

wherein the surface mounted semiconductor device is arranged above the pad pitch converting member within the bracket.

According to an aspect of the present invention, the pitch of pads of the motherboard does not have to correspond to the pitch of the pads of the semiconductor device. Specifically, the pitch of the pads of the motherboard may be arranged to correspond to the pitch of the motherboard side pads of the pad pitch converting member. When the pitch of the motherboard side pads is arranged to be greater than the pitch of the pads of the semiconductor device, a motherboard having pads arranged at a greater pitch may be used. That is, a motherboard manufactured with a fewer number of layers at a lower cost may be used.

DESCRIPTION OF THE PREFERRED EMBODIMENTS

In the following, preferred embodiments of the present invention are described with reference to the accompanying drawings.

First Embodiment

Figure 1:
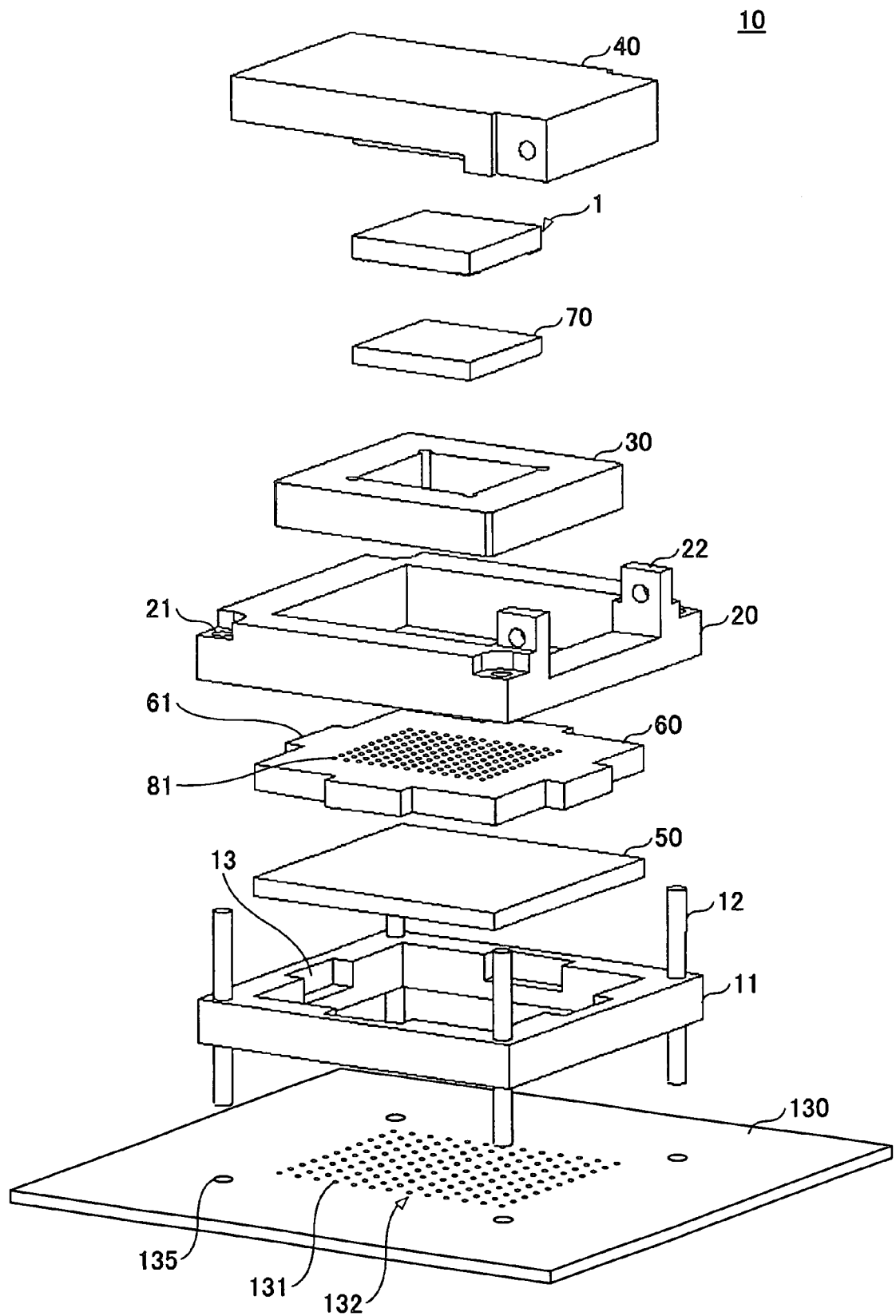
FIG. 1 is an exploded perspective view of a semiconductor device mounting socket according to a first embodiment of the present invention that is used for mounting a BGA semiconductor device on a motherboard.
Figure 2:
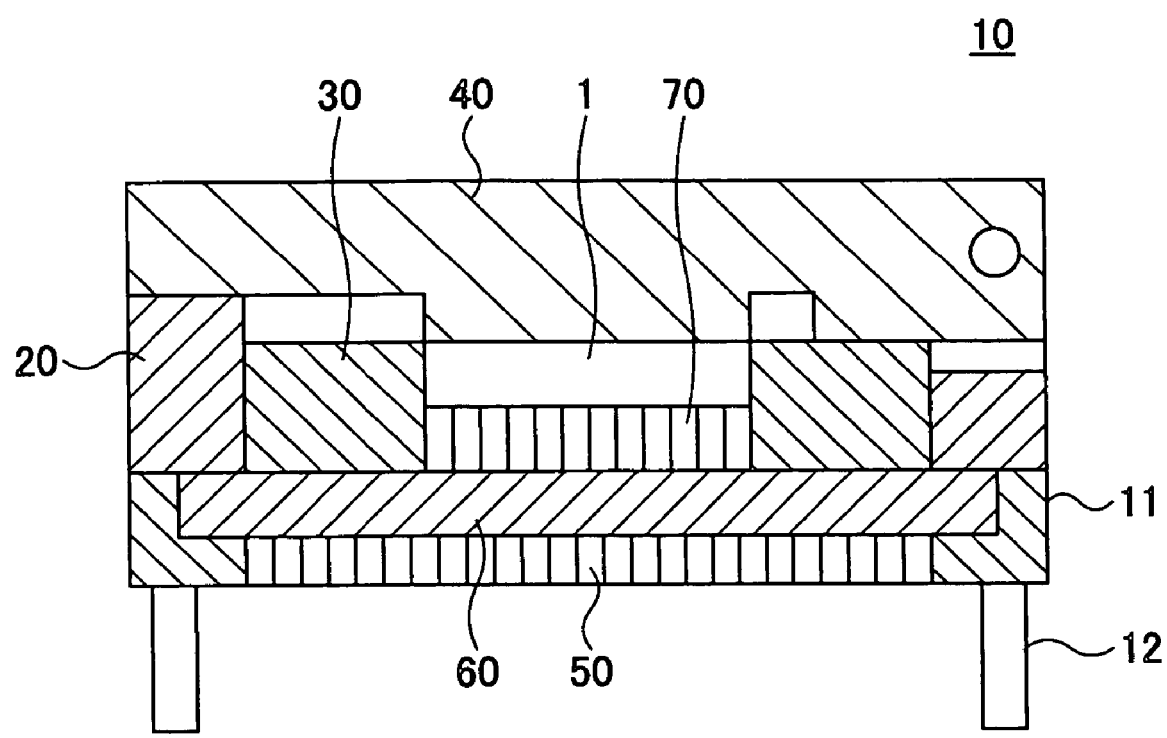
FIG. 2 is a cross-sectional view of the semiconductor device mounting socket of FIG. 1.
Figure 3:
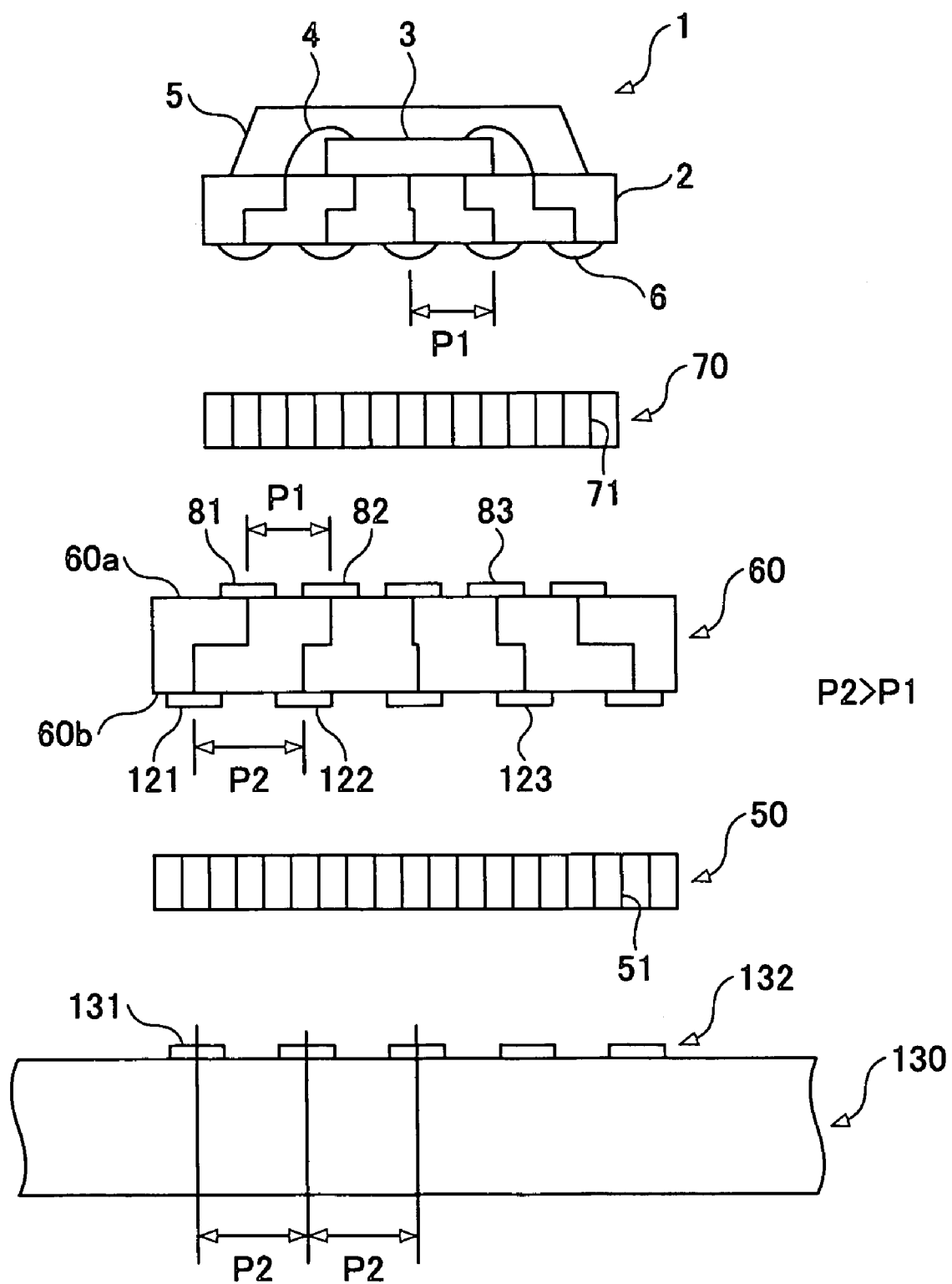
FIG. 3 is a diagram showing the arrangement of the BGA semiconductor device, anisotropic conductive sheets, and a pad pitch converting substrate that are accommodated within the semiconductor device mounting socket of FIG. 1.

FIG. 1 is an exploded perspective view of a semiconductor device mounting socket 10 according to a first embodiment of the present invention that is used for mounting a BGA semiconductor device 1 on a motherboard 130. FIG. 2 is a cross-sectional view of the semiconductor device mounting socket 10. FIG. 3 is a diagram showing the arrangement of the BGA semiconductor device 1, anisotropic conductive sheets 50 and 70, and a pad pitch converting substrate 60 that are accommodated within the semiconductor device mounting socket 10.

[Configuration of BGA Semiconductor Device 1]

As is shown in FIG. 3, the BGA semiconductor device 1 includes a substrate 2, a semiconductor chip 3 fixed to the substrate 2, wires 4 that electrically connect the semiconductor chip 3 and pads arranged on the substrate 2, a resin part 5 that seals the semiconductor chip 3 and the wires 4, and solder ball contacts 6 that are arranged into a lattice pattern on the lower face of the substrate 2 at a pitch p1. The pitch p1 of the contacts 6 may be 0.5 mm, for example. It is noted that the BGA semiconductor device 1 mounted on the motherboard 130 may be selected from BGA semiconductor devices of various sizes, for example.

[Configuration of Semiconductor Device Mounting Socket 10]

As is shown in FIG. 1, the semiconductor device mounting socket (simply referred to as 'socket' hereinafter) 10 includes a lower bracket 11, an upper bracket 20, an adjusting bracket 30, a cover 40, the lower anisotropic conductive sheet 50, the pad pitch converting substrate 60, and the upper anisotropic conductive sheet 70.

The lower bracket 11, the upper bracket 20, the pad pitch converting substrate 60, and the lower anisotropic conductive sheet 50 are arranged to be slightly larger than the estimated maximum size of the BGA semiconductor device 1. It is noted that the adjusting bracket 30 used in the socket 10 may be selected from adjusting brackets of various sizes according to the size of the BGA semiconductor device 1 that is mounted on the motherboard 130.

The lower bracket 11 is arranged into a rectangular frame structure, and includes positioning pins 12 arranged at the respective corner portions of its frame structure. Also, the lower bracket 11 has concave stepped portions 13 arranged at the inner side of its side edges for positioning the pad pitch converting substrate 60. The lower bracket 11 is configured to hold the lower anisotropic conductive sheet 50 and the pad pitch converting substrate 60 layered together.

The upper bracket 20 has the same rectangular structure as that of the lower bracket 11, and includes positioning through holes 21 arranged at its respective corner portions. The positioning through holes 21 and the positioning pins 12 are engaged so that the upper bracket 20 is positioned and fixed to the lower bracket 11.

The cover 40 is supported by hinge portions 22 of the upper bracket 20 and is configured to rotate around the hinge portions 22 on pins (not shown) to open and close with respect to the upper bracket 20. Further, the cover 40 is configured to be attached by screws (not shown) and fixed to the upper bracket 20 in the closed position.

The lower anisotropic conductive sheet. 50 and the pad pitch converting substrate 60 are arranged to correspond to the size of the lower bracket 11.

It is noted that the adjusting bracket 30 used in the socket 10 is selected from plural adjusting brackets having the same external size and openings of different sizes according to the size of the semiconductor device 1 being mounted on the motherboard 130.

Also, it is noted that the upper anisotropic conductive sheet 70 is selected from plural anisotropic conductive sheets in various sizes according to the size of the semiconductor device 1 being mounted on the motherboard 130.

As is shown in FIG. 3, in one example, the lower anisotropic conductive sheet 50 and the upper anisotropic conductive sheet 70 may be rubber sheets that include plural microscopic conductive needles 51 and 71, respectively.

Figure 4A:
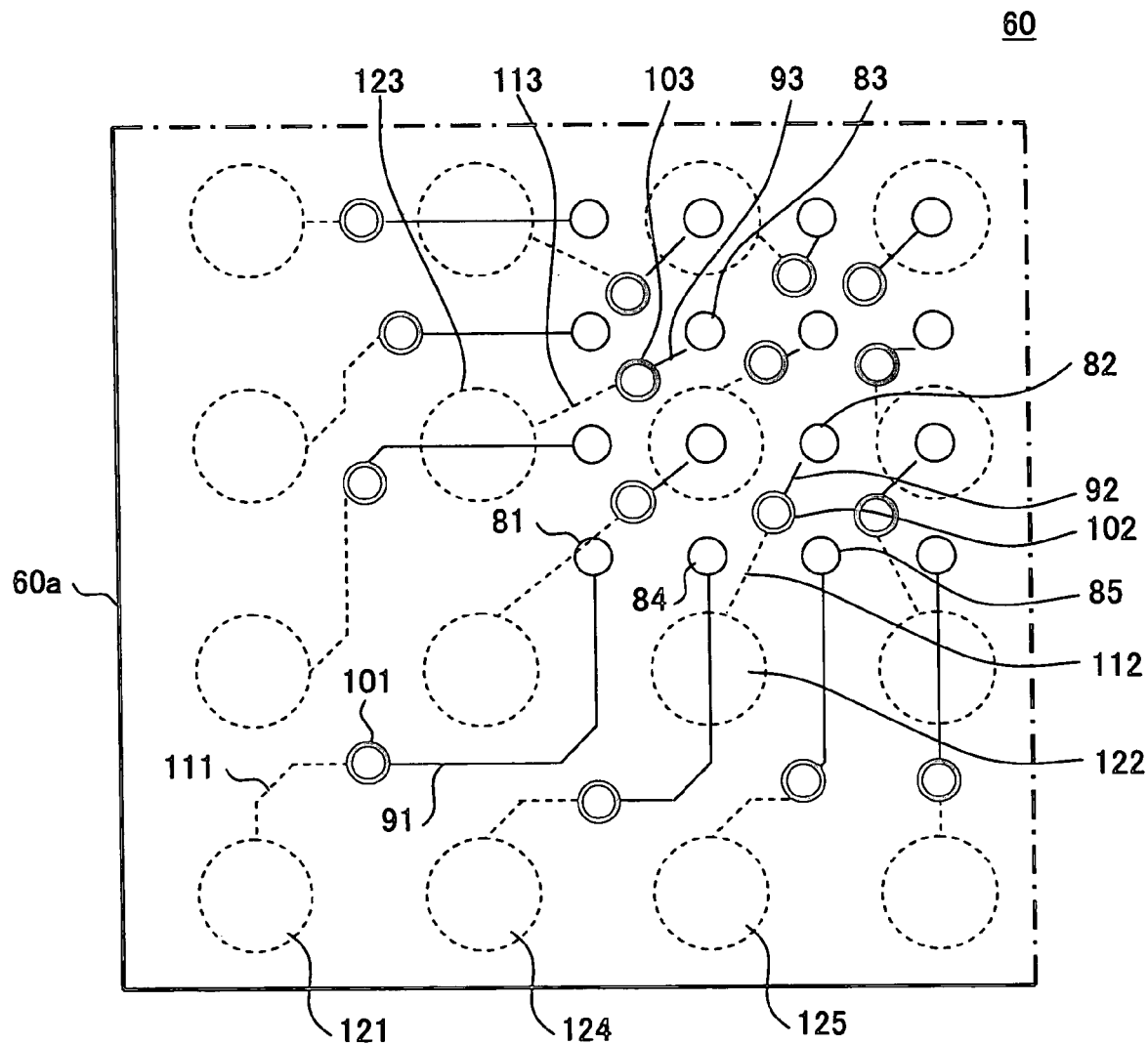
FIGS. 4A and 4B are enlarged views of a corner portion of the pad pitch converting substrate of the semiconductor device mounting socket of FIG. 1.
Figure 5A:
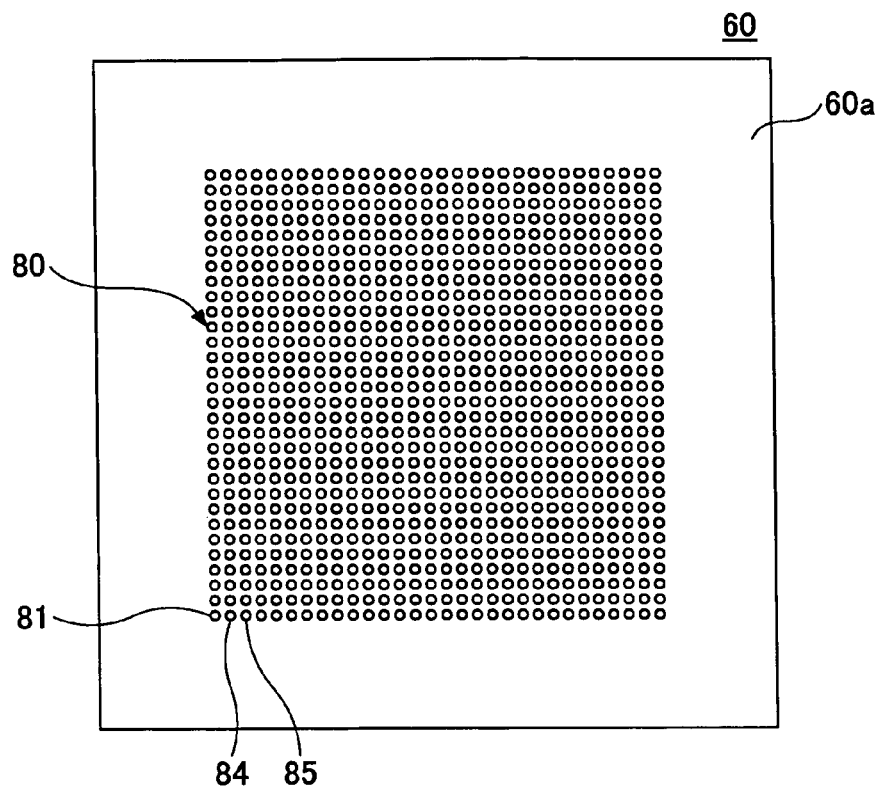
FIGS. 5A-5C are diagrams showing arrangement patterns of solder ball contacts of the BGA semiconductor device and the semiconductor device side pads of the pad pitch converting substrate.

As is shown in FIGS. 3, 4A, and 5A, the pad pitch converting substrate 60 has an upper face 60a on which semiconductor device side pads (e.g., 81 and 82) are arranged into a lattice pattern at pitch p1, and a lower face 60b on which motherboard side pads (e.g., 121 and 122) are arranged into a lattice pattern at pitch p2 that is approximately two times the pitch p1. The pitch p2 may be approximately 1.0 mm, for example. It is noted that the number of semiconductor device side pads arranged on the pad pitch converting substrate 60 may correspond to the estimated maximum number of pads arranged on the semiconductor device 1.

Figure 4B:
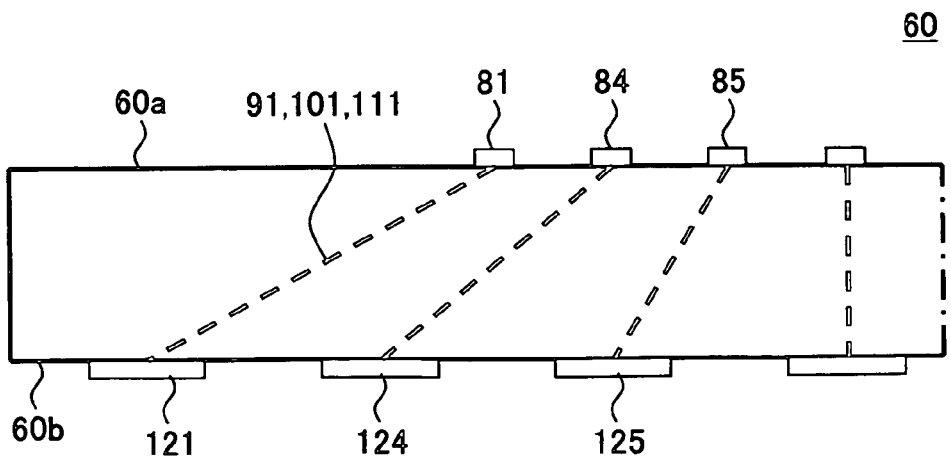

FIG. 4A is an enlarged plan view of a corner portion of the pad pitch converting substrate 60. FIG. 4B is a cross-sectional view of the corner portion of the pad pitch converting substrate 60. FIG. 5A is a plan view of the pad pitch converting substrate 60.

In FIG. 4A, the semiconductor device side pads (e.g., 81 and 82) are represented by small circles, the motherboard side pads (e.g., 121 and 122) are represented by large circles in broken lines, vias (e.g., 101 and 102) are represented by small bold circles, wiring patterns arranged on the upper face 60a (e.g., 91 and 92) are represented by solid lines, and wiring patterns arranged on the inner layers or the lower face 60b of the pad pitch converting substrate 60 (e.g., 111 and 112) are represented by broken lines.

The semiconductor device side pad 81 of the plural semiconductor device side pads arranged on the pad pitch converting substrate 60 is electrically connected via the wiring pattern 91, the via 101, and the wiring pattern 111, and is lead toward the outer edge side direction from its position at the upper face 60a, to the motherboard side pad 122. The semiconductor device side pad 82 is electrically connected via the wiring pattern 92, the via 102, and the wiring pattern 112, and is lead toward the outer edge side direction from its position at the upper face 60a, to the motherboard side pad 123. The other semiconductor device side pads are also lead toward the outer edge side direction of the pad pitch converting substrate 60 from their respective positions at the upper face 60a to be electrically connected to their corresponding motherboard side pads. In this way, the semiconductor side pads arranged into a lattice pattern at the pitch p1 on the upper face 60a of the pad pitch converting substrate 60 are spread out toward the outer edge side direction so that the pad pitch may be converted to the pitch p2 of the motherboard side pads at the lower face 60b of the pad pitch converting substrate 60 which pitch p2 is approximately twice the pitch p1. It is noted that such pad pitch conversion is performed by the layers within the pad pitch converting substrate 60.

In FIG. 5A, a square region 80 corresponding to the estimated maximum size of the semiconductor device 1 is shown. The semiconductor device side pads (e.g., 81, 84, and 85) are arranged into a lattice pattern within the region 80.

As is shown in FIG. 1, the pad pitch converting substrate 60 includes convex portions 61 protruding from its peripheral sides which convex portions 61 are used for positioning the pad pitch converting substrate 60.

It is noted that since pad pitch conversion is performed within the pad pitch converting substrate 60, a relatively large number of wiring layers are included in the pad pitch converting substrate 60 so that the overall number of layers of the pad pitch converting substrate 60 is increased. However, since the size of the pad pitch converting substrate 60 is relatively small, the cost for manufacturing the pad pitch converting substrate 60 may be prevented from significantly increasing.

As is shown in FIG. 2, the socket 10 is configured such that the convex portions 61 engage the concave portions 13 to position the pad pitch converting substrate 60 within the lower bracket 11, the lower anisotropic conductive sheet 50 is arranged at the lower side of the lower bracket 11 to come into contact with the lower face of the pad pitch converting substrate 60, the upper bracket 20 with the cover 40 is superposed on and fixed to the upper side of the lower bracket 11, the adjusting bracket 30 engages the upper bracket 20, and the upper anisotropic conductive sheet 70 engages the adjusting bracket 30 to be arranged on the upper face of the pad pitch converting substrate 60.

[Configuration of Motherboard 130]

As is shown in FIG. 3, the motherboard 130 includes a BGA semiconductor device mounting portion 132 at which pads 131 are arranged into a lattice pattern at the pitch p2 (e.g., 1.0 mm). By arranging the pitch of the pads 131 to be wider than the pitch p1, the number of wirings arranged between adjacent pads 131 may be increased to two wirings, for example, so that the number of layers of the motherboard 130 may not have to be increased. It is noted that a motherboard that is adapted for mounting a BGA semiconductor device of an old model with solder ball contacts arranged at a pitch of 1.0 mm, for example, may be used as the motherboard 130.

[In-Use State of Semiconductor Device Mounting Socket 10]

In the following, the manner in which the socket 10 is used is described.

The socket 10 is positioned and fixed to the BGA semiconductor device mounting portion 132 of the motherboard 130 by having the positioning pins 12 of the socket 10 engage positioning holes 135 of the motherboard 130.

In this state, the BGA semiconductor device 1 is arranged within the adjusting bracket 130, and the cover 40 is closed and fixed to the upper bracket 20 by screws (not shown). In turn, the BGA semiconductor device 1 is pushed by the cover 40, and the upper anisotropic conductive sheet 70 is compressed between the BGA semiconductor device 1 and the pad pitch converting substrate 60 so that the solder ball contacts 6 are electrically connected to the semiconductor side pads via the upper anisotropic conductive sheet 70. Also, the lower anisotropic conductive sheet 50 is compressed between the pad pitch converting substrate 60 and the motherboard 130 so that the motherboard side pads are connected to the pads 131 via the lower anisotropic conductive sheet 50. Accordingly, the solder ball contacts 6 of the BGA semiconductor device 1 are electrically connected to their corresponding pads 131 of the mother board 130 via the upper anisotropic conductive sheet 70, the pad pitch converting substrate 60, and the lower anisotropic conductive sheet 50. In this way, the BGA semiconductor device 1 is mounted on the motherboard 130.

It is noted that the BGA semiconductor device 1 may be removed from the socket 10 by releasing the screws and opening the cover 40.

As is described above, the size of the pad pitch converting substrate 60 and the size of the lower anisotropic conductive sheet 50 are arranged to correspond to the maximum likely size of the BGA semiconductor device 1. The socket 10 is configured to be capable of interchanging its adjusting bracket 30 for mounting BGA semiconductor devices in various sizes. In other words, the semiconductor device mounting socket 10 of the present embodiment comprises a common socket for mounting BGA semiconductor devices of various sizes.

Figure 5B:
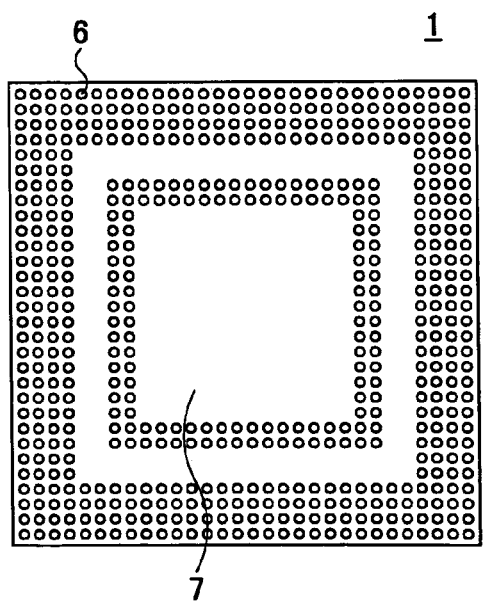
Figure 5C:
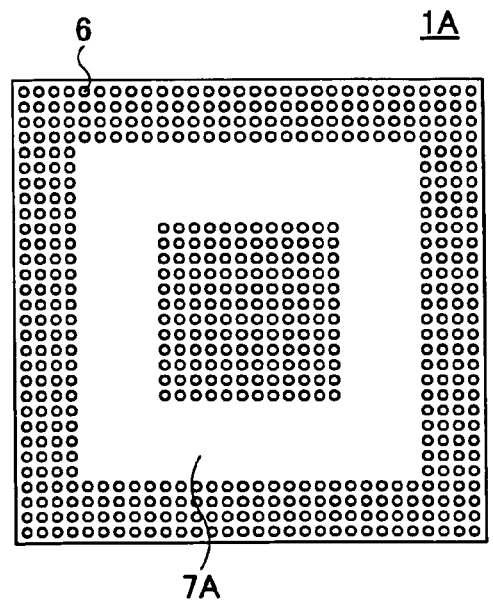

Upon investigating BGA semiconductor devices currently on the market, it has been found that although the pitch of the solder ball contacts of BGA semiconductor devices may be the same, the arrangement pattern of the solder ball contacts on the lower face of the respective BGA semiconductor devices may vary depending on manufacturers, for example. FIGS. 5B and 5C illustrate a specific example of such a variation in BGA semiconductor devices. The BGA semiconductor device 1 shown in FIG. 5B includes a center portion 7 in which solder ball contacts 6 are not arranged. On the other hand, a BGA semiconductor device 1A shown in FIG. 5C includes an intermediate portion 7A between a center portion and a peripheral portion in which solder ball contacts 6 are not arranged.

As can be appreciated from the above descriptions, the upper face 60a of the pad pitch converting substrate 60 has semiconductor device side pads arranged throughout its entire region 80. Therefore, the solder ball contacts 6 of the BGA semiconductor device 1 may be electrically connected to their corresponding semiconductor side pads regardless of whether the BGA semiconductor device being mounted corresponds to the BGA semiconductor device 1 shown in FIG. 5B or the BGA semiconductor device 1A shown in FIG. 5C. In other words, the semiconductor device mounting socket 10 of the present embodiment is adapted to be used for mounting the BGA semiconductor device 1 of FIG. 5B as well as the BGA semiconductor device 1A of FIG. 5C.

[Modified Example]

According to a modified example, the semiconductor device side pads and/or the motherboard side pads of the pad pitch converting substrate 60 may corresponds to solder balls.

Also, it is noted that even when the pitch of the solder ball contacts of a BGA semiconductor device is narrowed to less than 0.5 mm in future applications, a pad pitch converting substrate adapted for the narrowed pitch of the solder ball contacts may be created so that changes may not have to be implemented on the motherboard.

In another modified example, the socket 10 may be used for mounting a LGA semiconductor device.

In another modified example, the arrangement pattern of the pads of the pad pitch converting substrate 60 used in the socket 10 may be adapted for mounting a surface mounted package device such as the QFI package or the QFJ package that has lead pins extending from four of its side surfaces. It is noted that a surface mounted semiconductor package device does not require the motherboard to include mount holes and is electrically connected to the motherboard by being soldered on the upper face of the motherboard, for example.

In another modified example, the pad pitch converting substrate 60 may be configured to narrow the pad pitch of the semiconductor device side pads so that the motherboard side pads may be arranged at a narrower pitch than the pitch of the semiconductor side pads. In other words, the pad pitch of the motherboard side pads may be widened or narrowed with respect to the pad pitch of the semiconductor device side pads.

In another modified example, anisotropic conductive sheets corresponding to rubber sheets having conductive grains dispersed therein may be used as the lower anisotropic conductive sheet 50 and the upper anisotropic conductive sheet 70. In another modified example, an upper/lower connection sheet corresponding to a rubber sheet including V-shaped needle members arranged horizontally along the rubber sheet with their tips protruding from the upper face side and the lower face side of the rubber sheet as spring connection points may be used as the anisotropic conductive sheet 50 and the upper anisotropic conductive sheet 70. In yet another modified example, an upper/lower connection sheet as is illustrated in FIG. 6 may be used.

Figure 6:
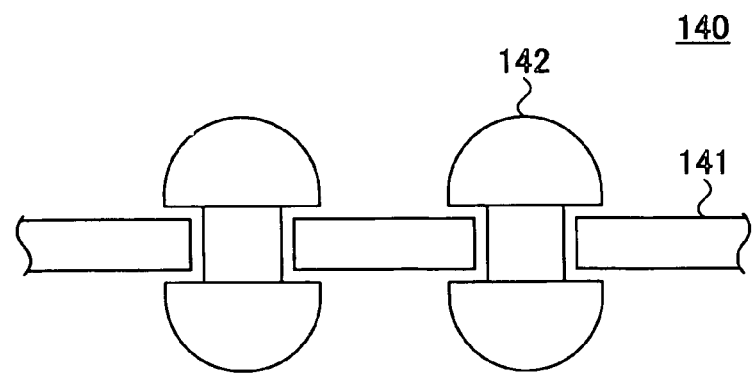
FIG. 6 is a diagram showing an exemplary configuration of an upper/lower connection sheet.

The upper/lower connection sheet 140 shown in FIG. 6 includes an insulating sheet 141 and conductive rubber terminals 142 that are arranged in the insulating sheet 141. It is noted that terminals made of silicon rubber with metal plating may be used in place of the conductive rubber terminals 142, in another modified example.

Second Embodiment

Figure 7:
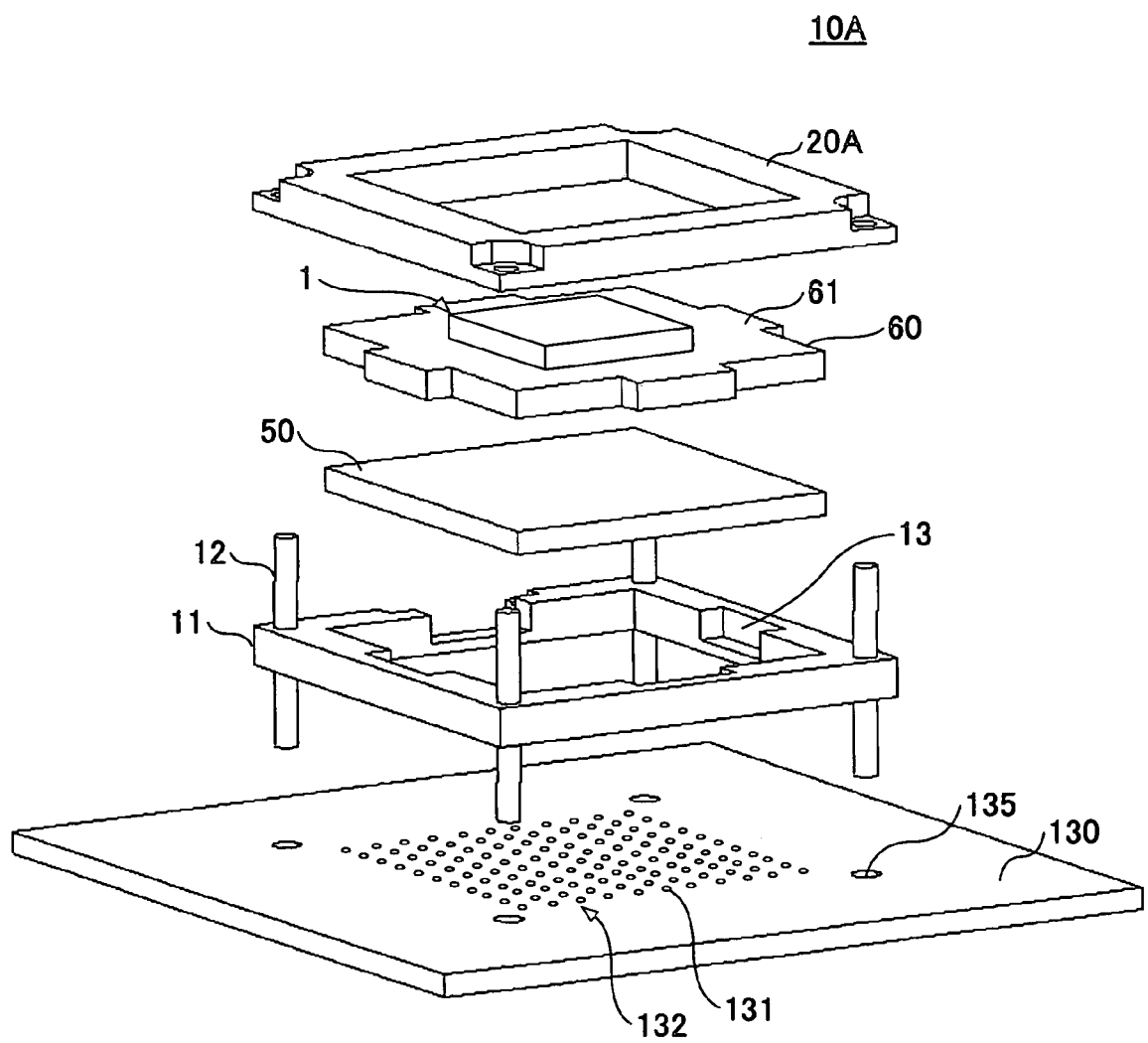
FIG. 7 is an exploded perspective view of a semiconductor device mounting socket according to a second embodiment of the present invention that is used for mounting a BGA semiconductor device on a motherboard.
Figure 8:
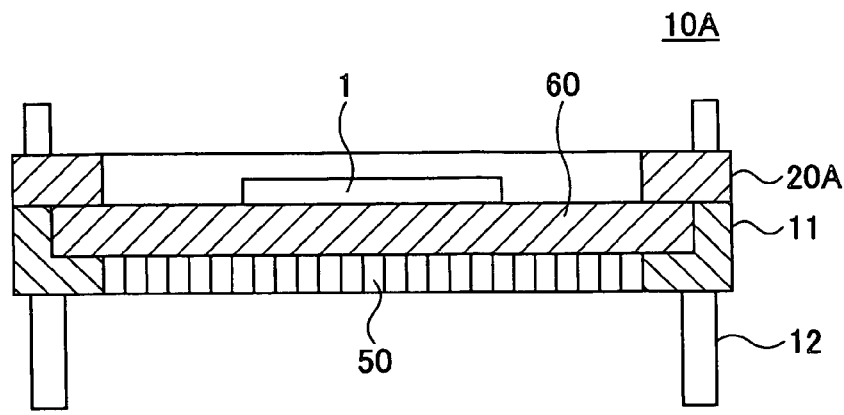
FIG. 8 is a cross-sectional view of the semiconductor device mounting socket of FIG. 7.
Figure 9:
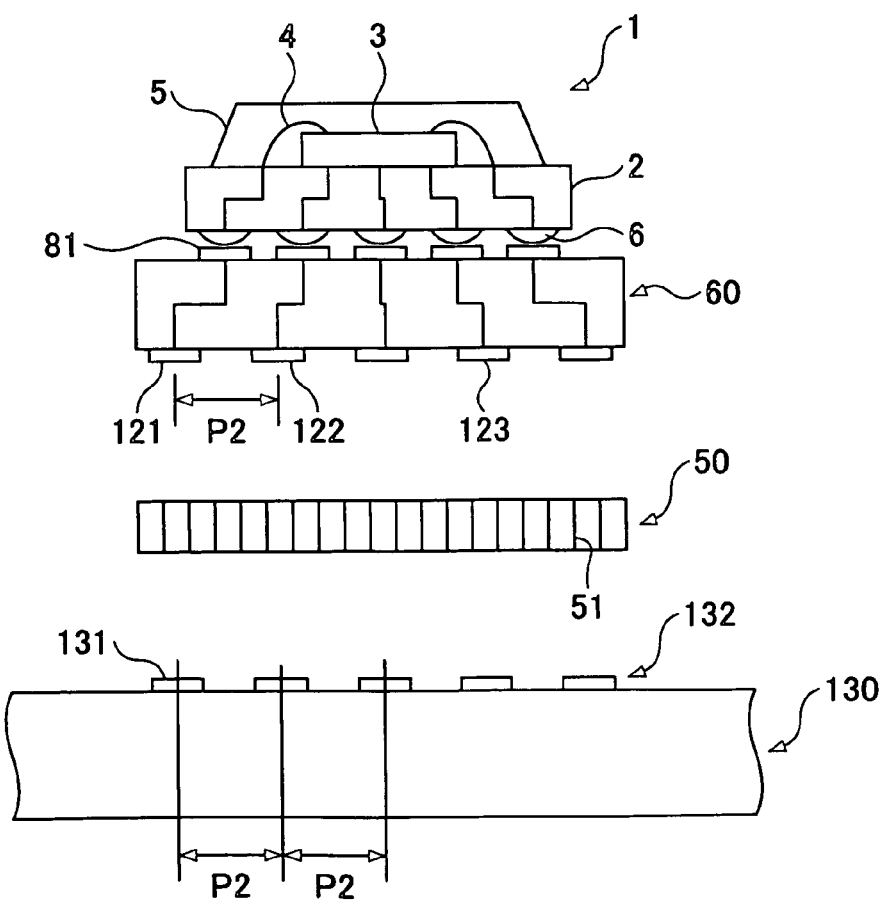
FIG. 9 is a diagram showing the arrangement of the BGA semiconductor device, an anisotropic conductive sheet, and a pad pitch converting substrate that are accommodated within the semiconductor device mounting socket of FIG. 7.

FIG. 7 is an exploded perspective view of a semiconductor device mounting socket 10A according to a second embodiment of the present invention that is used for mounting a BGA semiconductor device 1 on a motherboard 130. FIG. 8 is a cross-sectional view of the semiconductor device mounting socket 10A. FIG. 9 is a diagram showing the arrangement of the semiconductor device 1, an anisotropic conductive sheet 50, and a pad pitch converting substrate 60 that are accommodated within the semiconductor device mounting socket 10A. It is noted that in the above drawings, components that are identical to those shown in FIGS. 1 through 3 are given the same reference numerals.

The socket 10A according to the present embodiment differs from the socket 10 of the first embodiment in that it does not include the upper anisotropic conductive sheet 70, the adjusting bracket 30, and the cover 40. Specifically, the socket 10A includes a lower bracket 11, an upper bracket 20A, a lower anisotropic conductive sheet 50, and a pad pitch converting substrate 60.

In the present embodiment, the BGA semiconductor device 1 is soldered to the pad pitch converting substrate 60 beforehand.

The socket 10A may be used in the manner described below, for example.

First, positioning pins 12 of the lower bracket 11 are arranged to engage positioning holes 135 of the motherboard 130 so that the lower bracket 11 is positioned and fixed to a BGA semiconductor device mounting portion 132 of the motherboard 130. It is noted that the lower anisotropic conductive sheet 50 is accommodated within the lower bracket 11 and placed on the motherboard 130.

In this state, the pad pitch converting substrate 60 with the BGA semiconductor device 1 soldered thereon is positioned within the lower bracket 11 by having convex portions 61 of the pad pitch converting substrate 60 engage concave portions 13 of the lower bracket 11. Then, the upper bracket 20A is fixed to the lower bracket 11 by screws, for example.

The upper bracket 20A that is fixed to the lower bracket 11 engages convex portions 61 of the pad pitch converting substrate 60 to prevent the pad pitch converting substrate 60 from being detached and pushes the convex portions 61 towards the lower anisotropic conductive sheet 50. In turn, the lower anisotropic conductive sheet 50 is compressed between the pad pitch converting substrate 60 and the motherboard 130 so that motherboard side pads (e.g., 121, 122, and 123) of the pad pitch converting substrate 60 and the pads 131 of the motherboard 130 may be electrically connected via the lower anisotropic conductive sheet 50. In this way, the solder ball contacts 6 of the BGA semiconductor device 1 may be electrically connected to their corresponding pads 131 via the pad pitch converting substrate 60 and the lower anisotropic conductive sheet 50, and the BGA semiconductor device 1 may be mounted on the motherboard 130.

It is noted that when the BGA semiconductor device breaks down, the upper bracket 20A may be detached, and the BGA semiconductor device 1 along with the pad pitch converting substrate 60 may be removed from the lower bracket 11. Then, the broken BGA semiconductor device 1 may be replaced by a properly functioning BGA semiconductor device 1 (i.e., BGA semiconductor device that is soldered onto a pad pitch converting substrate 60 beforehand). Then, the upper bracket 20A may be attached to the lower bracket 11 again.

Third Embodiment

Figure 10:
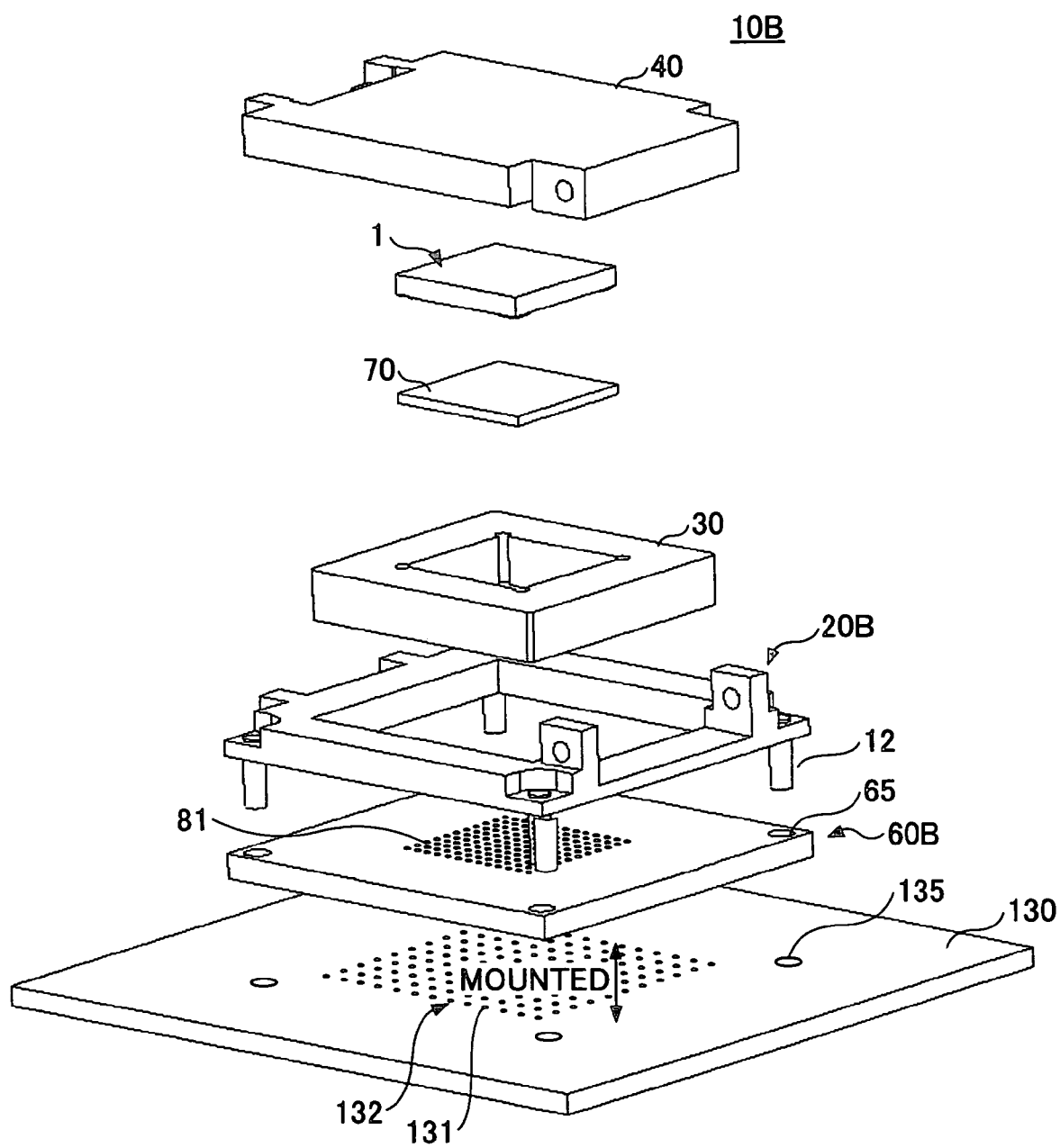
FIG. 10 is an exploded perspective view of a semiconductor device mounting socket according to a third embodiment of the present invention that is used for mounting a BGA semiconductor device on a motherboard.
Figure 11:
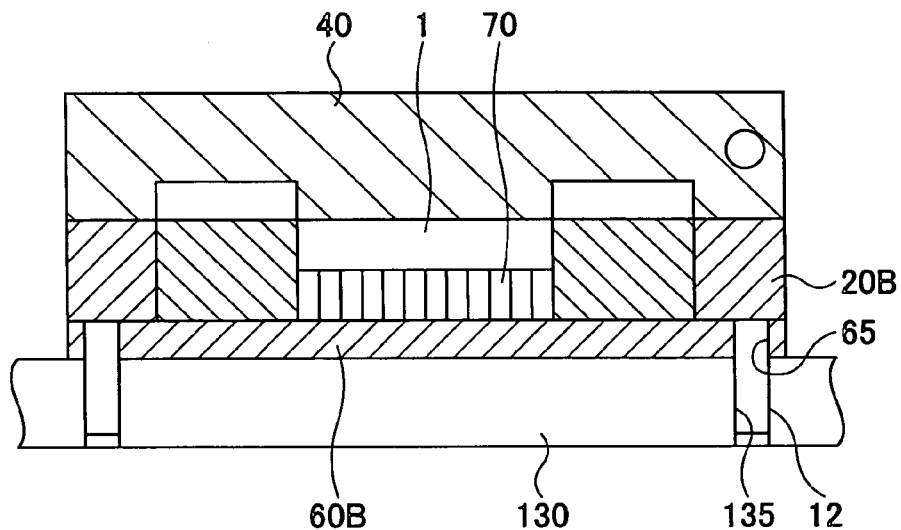
FIG. 11 is a cross-sectional view of the semiconductor device mounting socket of FIG. 10.
Figure 12:
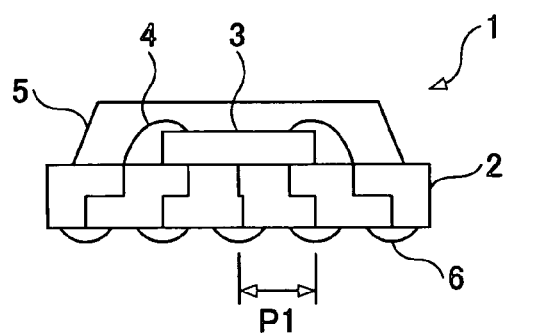
FIG. 12 is a diagram showing the arrangement of the BGA semiconductor device, an anisotropic conductive sheet, and a pad pitch converting substrate that are accommodated within the semiconductor device mounting socket of FIG. 10.
Figure 12:
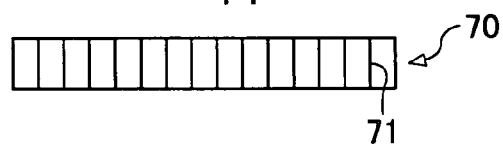
Figure 12:
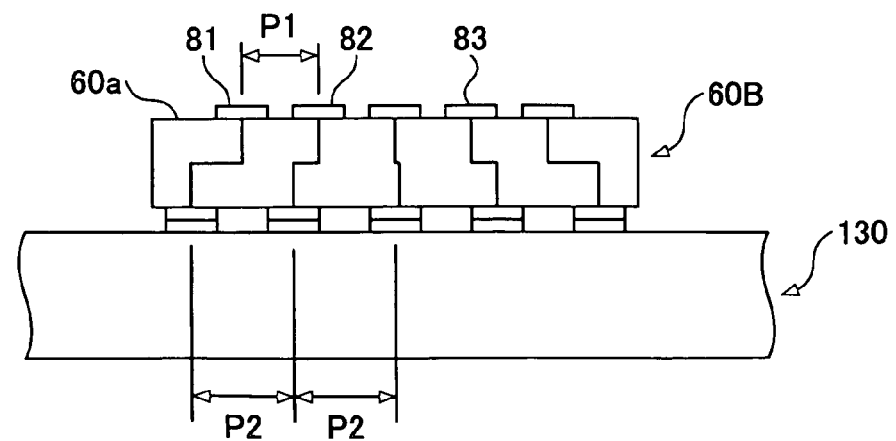

FIG. 10 is an exploded perspective view of a semiconductor device mounting socket 10B according to a third embodiment of the present invention that is used for mounting a BGA semiconductor device 1 on a motherboard 130. FIG. 11 is a cross-sectional view of the semiconductor device mounting socket 10B. FIG. 12 is a diagram showing the arrangement of the semiconductor device 1, an anisotropic conductive sheet 70, and a pad pitch converting substrate 60 that are accommodated within the socket 10A. It is noted that in the above drawings, components that are identical to those shown in FIGS. 1 through 3 are given the same reference numerals.

The socket 10B differs from the socket 10 of the first embodiment in that it does not include the lower bracket 11 and the lower anisotropic conductive sheet 50. Specifically, the socket 10B of the present embodiment includes a bracket 20B, an adjusting bracket 30, a cover 40, a pad pitch converting substrate 60B, and an upper anisotropic conductive sheet 70.

The bracket 20B includes positioning pins 12 arranged at its corner portions. The cover 40 is attached to the bracket 20B.

The pad pitch converting substrate 60B is configured to be larger than the bracket 20B and has positioning holes 65 arranged at its corner portions. As is shown in FIG. 11, the positioning holes 65 are used to position the pad pitch converting substrate 60B on the motherboard 130. It is noted that in the present embodiment, the pad pitch converting substrate 60B is mounted on the motherboard 130 beforehand by soldering motherboard side pads of the pad pitch converting substrate 60B to pads of the motherboard 130 (e.g., 131 and 132 of FIG. 10), for example.

The socket 10B of the present embodiment may be used in the manner described below, for example.

First, the bracket 20B is fixed to the motherboard 130 by having the positioning pins 12 engage the positioning holes 65 of the pad pitch converting substrate 60B and positioning holes 135 of the motherboard 130.

In this state, the adjusting bracket 30 is arranged within the bracket 20B, the upper anisotropic conductive sheet 70 is arranged within the bracket 20B, the BGA semiconductor device 1 is arranged within the bracket 20B, and the cover 40 is closed and fixed to the bracket 20B by screws (not shown). In this way, the BGA semiconductor device 1 is pushed toward the pad pitch converting substrate 60B by the cover 40 so that the upper anisotropic conductive sheet 70 is compressed between the BGA semiconductor device 1 and the pad pitch converting substrate 60B and the solder ball contacts are electrically connected to semiconductor side pads 81 of the pad pitch converting substrate 60B via the upper anisotropic conductive sheet 70. Accordingly, the solder ball contacts 6 may be electrically connected to the pads of the motherboard 130, and the BGA semiconductor device 1 may be mounted on the motherboard 130.

It is noted that the BGA semiconductor device 1 may be removed by releasing the screws and opening the cover 40.

Further, the present invention is not limited to these embodiments, and variations and modifications may be made without departing from the scope of the present invention.

The present application is based on and claims the benefit of the earlier filing date of Japanese Patent Application No. 2005-264359 filed on Sep. 12, 2005, the entire contents of which are hereby incorporated by reference.

What is claimed is:

1. A semiconductor device mounting socket that is fixed to a motherboard and is used for mounting a surface mounted semiconductor device on the motherboard, the semiconductor device mounting socket comprising:

a bracket that is fixed to the motherboard; and a pad pitch converting member that is arranged within the bracket, the pad pitch converting member including an upper face on which semiconductor device side pads are arranged at a first pitch corresponding to a pitch of pads of the surface mounted semiconductor device, and a lower face on which motherboard side pads that are electrically connected to the semiconductor device side pads are arranged at a second pitch that is different from the first pitch;

wherein the surface mounted semiconductor device is arranged above the pad pitch converting member within the bracket.

2. The semiconductor device mounting socket as claimed in claim 1, further comprising:

a lower sheet that is arranged on the lower face side of the pad pitch converting member within the bracket which lower sheet is configured to make electrical connection between the motherboard side pads of the pad pitch converting member and pads of the motherboard; and an upper sheet that is arranged on the upper face side of the pad pitch converting member within the bracket which upper sheet is configured to make electrical connection between the pads of the surface mounted semiconductor device and the semiconductor device side pads of the pad pitch converting member;

wherein the surface mounted semiconductor device is arranged on an upper face of the upper sheet within the bracket.

3. The semiconductor device mounting socket as claimed in claim 1, further comprising:

a lower sheet that is arranged within the bracket and is configured to make electrical connection between the motherboard side pads of the pad pitch converting member and pads of the motherboard;

wherein the pads of the surface mounted semiconductor device are electrically connected to the semiconductor device side pads of the pad pitch converting member and the surface mounted semiconductor device is mounted on the upper face of the pad pitch converting member beforehand; and the pad pitch converting member and the surface mounted semiconductor device that are electrically connected are arranged on an upper face of the lower sheet within the bracket.

4. The semiconductor device mounting socket as claimed in claim 1, further comprising:

an upper sheet that is arranged within the bracket and is configured to make electrical connection between the pads of the surface mounted semiconductor device and the semiconductor device side pads of the pad pitch converting member;

wherein the mother board side pads of the pad pitch converting member are electrically connected to pads of the motherboard and the pad pitch converting member is mounted on the motherboard beforehand; and the surface mounted semiconductor device is arranged on an upper face of the upper sheet within the bracket.

5. The semiconductor device mounting socket as claimed in claim 1, further comprising:

a region on the upper face of the pad pitch converting member in which region the semiconductor device side pads are arranged into a lattice pattern, the region having a dimension corresponding to an estimated maximum dimension of the surface mounted semiconductor device.

6. The semiconductor device mounting socket as claimed in claim 5, further comprising:

a corresponding adjusting bracket that is selected from a plurality of adjusting brackets which adjusting brackets have differing internal dimensions which corresponding adjusting bracket is selected according to a dimension of the surface mounted semiconductor device;

wherein the corresponding adjusting bracket is arranged within the bracket, and the surface mounted semiconductor device is arranged within the corresponding adjusting bracket.

\* \* \* \* \*

UNITED STATES PATENT AND TRADEMARK OFFICE
CERTIFICATE OF CORRECTION

PATENT NO. : 7,397,669 B2  
APPLICATION NO. : 11/410817  
DATED : July 8, 2008  
INVENTOR(S) : Koichi Kiryu et al.

Page 1 of 1

It is certified that error appears in the above-identified patent and that said Letters Patent is hereby corrected as shown below:

Title Page, item [75] Column 1 (Inventors), Line 1, change "Shimotakai" to --Shimotakai-gun--.

Column 10, Line 27, change "mother board" to --motherboard--.

Signed and Sealed this

Twenty-eighth Day of October, 2008

JON W. DUDAS  
*Director of the United States Patent and Trademark Office*